US008952566B2

(12) United States Patent
Harris et al.

(10) Patent No.: US 8,952,566 B2
(45) Date of Patent: Feb. 10, 2015

(54) CHASSIS SLOTS ACCEPTING BATTERY MODULES AND OTHER MODULE TYPES

(75) Inventors: Shaun L. Harris, Sammamish, WA (US); Christian L. Belady, Mercer Island, WA (US); Eric C. Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 714 days.

(21) Appl. No.: 12/912,696

(22) Filed: Oct. 26, 2010

(65) Prior Publication Data

US 2012/0098343 A1    Apr. 26, 2012

(51) Int. Cl.
| | |
|---|---|
| *H02J 7/00* | (2006.01) |
| *H02J 9/06* | (2006.01) |
| *G06F 1/18* | (2006.01) |
| *G06F 1/30* | (2006.01) |
| *H02J 7/34* | (2006.01) |
| *H05K 7/14* | (2006.01) |

(52) U.S. Cl.
CPC .................. *H02J 9/061* (2013.01); *G06F 1/183* (2013.01); *G06F 1/187* (2013.01); *G06F 1/30* (2013.01); *H02J 7/34* (2013.01); *H05K 7/1492* (2013.01)
USPC .......................................................... 307/66

(58) Field of Classification Search
USPC ............ 307/66; 361/788, 796–803; 713/300, 713/314
See application file for complete search history.

(56) References Cited

U.S. PATENT DOCUMENTS

| | | | |
|---|---|---|---|
| 2,798,898 | A | 7/1957 | Popovich |
| 3,187,086 | A | 6/1965 | Moodie |
| 3,346,687 | A | 10/1967 | Giger et al. |
| 4,849,581 | A | 7/1989 | Larkin et al. |
| 5,214,314 | A | 5/1993 | Dillard et al. |
| 5,466,889 | A | 11/1995 | Faulkner et al. |
| 5,486,651 | A | 1/1996 | Morgan |
| 5,694,312 | A | 12/1997 | Brand et al. |
| 5,760,339 | A | 6/1998 | Faulkner et al. |
| 5,918,641 | A | 7/1999 | Hardy et al. |
| 5,969,938 | A | 10/1999 | Byrne et al. |
| 6,040,976 | A | 3/2000 | Bruner et al. |
| 6,184,594 | B1 | 2/2001 | Kushnarenko |
| 6,381,122 | B2 | 4/2002 | Wagener |
| 6,392,141 | B1 | 5/2002 | Smith |

(Continued)

FOREIGN PATENT DOCUMENTS

CN    1993699    7/2007

OTHER PUBLICATIONS

"Battery Management Solutions: High Performance Analog ICs", *Linear Technology Corporation*, Available at <http://www.linear.com/pc/downloadDocument.do?id=10777>,(2010),32 pages.

(Continued)

*Primary Examiner* — Jared Fureman
*Assistant Examiner* — Duc M Pham
(74) *Attorney, Agent, or Firm* — Ladislav Kusnyer; Judy Yee; Micky Minhas (57) ABSTRACT

A chassis includes a component interconnect board having multiple multi-function slots coupled thereto. Each of the multi-function slots is configured to accept different types of modules, including a battery module and one or more other types of modules, such as server modules or storage modules. The component interconnect board also includes a power bus coupled to receive external power and route the external power to the multiple multi-function slots.

20 Claims, 7 Drawing Sheets

(56) References Cited

U.S. PATENT DOCUMENTS

| | | | |
|---|---|---|---|
| 6,754,066 B2 | 6/2004 | Doan et al. | |
| 6,786,749 B2 | 9/2004 | Meiners et al. | |
| 6,836,098 B1 | 12/2004 | O'Brien | |
| 6,856,047 B2 | 2/2005 | Murabayashi et al. | |
| 6,934,147 B2 | 8/2005 | Miller et al. | |
| 7,173,811 B2 | 2/2007 | Abrahamsen et al. | |
| 7,173,821 B2 | 2/2007 | Coglitore | |
| 7,210,048 B2 | 4/2007 | Bodas | |
| 7,254,742 B2* | 8/2007 | Hayashi | 714/14 |
| 7,271,506 B1 | 9/2007 | Bersiek | |
| 7,296,172 B2 | 11/2007 | Hsu et al. | |
| 7,339,786 B2* | 3/2008 | Bottom et al. | 361/679.41 |
| 7,379,305 B2 | 5/2008 | Briggs et al. | |
| 7,395,444 B2 | 7/2008 | Ives | |
| 7,425,682 B2 | 9/2008 | Rasmussen et al. | |
| 7,440,260 B2 | 10/2008 | Parker et al. | |
| 7,450,368 B2 | 11/2008 | Parker et al. | |
| 7,495,415 B2 | 2/2009 | Kanouda et al. | |
| 7,509,506 B2 | 3/2009 | Bahali et al. | |
| 7,514,815 B2 | 4/2009 | Paik et al. | |
| 7,519,909 B2 | 4/2009 | Kuiawa et al. | |
| 7,533,283 B2 | 5/2009 | Fung | |
| 7,542,268 B2 | 6/2009 | Johnson, Jr. | |
| 7,560,831 B2 | 7/2009 | Whitted et al. | |
| 7,561,411 B2 | 7/2009 | Johnson, Jr. | |
| 7,718,889 B2 | 5/2010 | Rasmussen et al. | |
| 7,760,516 B2 | 7/2010 | Johnson et al. | |
| 7,782,596 B2 | 8/2010 | Ross | |
| 7,791,894 B2* | 9/2010 | Bechtolsheim | 361/752 |
| 7,857,214 B2 | 12/2010 | Saliaris | |
| 8,080,900 B2 | 12/2011 | Corhodzic et al. | |
| 8,384,244 B2 | 2/2013 | Peterson et al. | |
| 8,487,473 B2 | 7/2013 | Peterson et al. | |
| 8,782,443 B2 | 7/2014 | Belady et al. | |
| 2001/0003207 A1 | 6/2001 | Kling et al. | |
| 2003/0052543 A1 | 3/2003 | Boost | |
| 2003/0109965 A1 | 6/2003 | Gee | |
| 2004/0000815 A1 | 1/2004 | Pereira | |
| 2004/0163001 A1 | 8/2004 | Bodas | |
| 2004/0229621 A1 | 11/2004 | Misra | |
| 2004/0231875 A1 | 11/2004 | Rasmussen et al. | |
| 2005/0052805 A1 | 3/2005 | Sato et al. | |
| 2005/0258922 A1 | 11/2005 | Rowe et al. | |
| 2006/0002056 A1 | 1/2006 | Abrahamsen et al. | |
| 2006/0151190 A1 | 7/2006 | Rasmussen et al. | |
| 2006/0248325 A1 | 11/2006 | Fung | |
| 2006/0267409 A1 | 11/2006 | Mullet et al. | |
| 2007/0037455 A1 | 2/2007 | Cabrera et al. | |
| 2007/0168088 A1 | 7/2007 | Ewing et al. | |
| 2007/0187343 A1 | 8/2007 | Colucci et al. | |
| 2007/0217125 A1 | 9/2007 | Johnson | |
| 2007/0217178 A1 | 9/2007 | Johnson et al. | |
| 2007/0278860 A1 | 12/2007 | Krieger et al. | |
| 2008/0197706 A1 | 8/2008 | Nielsen | |
| 2008/0245083 A1 | 10/2008 | Tutunoglu et al. | |
| 2008/0268331 A1* | 10/2008 | Douglas | 429/100 |
| 2009/0021078 A1* | 1/2009 | Corhodzic et al. | 307/67 |
| 2009/0034166 A1 | 2/2009 | Rasmussen et al. | |
| 2009/0034167 A1 | 2/2009 | Rasmussen et al. | |
| 2009/0073641 A1 | 3/2009 | Ross | |
| 2009/0112522 A1 | 4/2009 | Rasmussen | |
| 2009/0195075 A1 | 8/2009 | Ziegler et al. | |
| 2009/0223240 A1 | 9/2009 | Bean | |
| 2009/0309570 A1 | 12/2009 | Lehmann et al. | |
| 2010/0020475 A1 | 1/2010 | Spitaels et al. | |
| 2010/0275441 A1 | 11/2010 | Rasmussen et al. | |
| 2011/0296225 A1 | 12/2011 | Belady | |
| 2011/0304211 A1 | 12/2011 | Peterson | |
| 2011/0316338 A1 | 12/2011 | Peterson | |
| 2012/0079321 A1* | 3/2012 | Williams | 714/14 |

OTHER PUBLICATIONS

"End-to-End Embedded Power Solutions 2010 Product Selection Guide", *Lineage Power*, (2010),32 pages.

"Lineage Power Data Center", *Retrieved from:* <http://www.lineagepower.com/?page_id=275> on Dec. 9, 2010, (2010),2 pages.

"Lineage Power Energy Systems", Retrieved from: <http://www.lineagepower.com/?page_id=285> on Dec. 9, 2010, (2010),5 pages.

"MopUPS", Retrieved from: <http://www.chloridepower.com/en/USA/Monitoring-Tools/Software-for-UPS-monitoring-and-computer-shutdown/> on Feb. 25, 2010, (Feb. 24, 2010),2 pages.

"PowerVision© UPS Power Management Software for Enterprises", *Powerware*, Available at <http://www.computerenvironmental.com/software/Powervision.pdf>,(Jun. 2003),6 pages.

"SmartPro Rack/Tower UPS", Retrieved from: <http://www.upsgalaxy.com/pdf/1514.pdf> on Feb. 24, 2010, Tripp Lite,(Feb. 24, 2010),5 pages.

"The High-end UPS for Top Security", *Online USV Syteme AG*, Available at <http://www.online-usv.de/downloads/db_xrt_en_2009-10-28.pdf>,(Feb. 24, 2010),6 pages.

"Ups Monitoring Software: Cut Down the Burden of Manual Ups Handling", Retrieved from: <http://www.articlesbase.com/software-articles/ups-monitoring-software-cut-down-the-burden-of-manual-ups-handling-716430.html> on Feb. 25, 2010, (Jan. 9, 2009), 1 page.

Felter, Wes et al., "A Performance-Conserving Approach for Reducing Peak Power Consumption in Server Systems", *In Proceedings of ICS' 05*, (Jun. 2005),10 pages.

Kian "Monitoring UPS Power Status Using Network UPS Tools (NUT) 2.2.0 on Multiple OpenSuSE 10.3 Servers", Retrieved from: <http://www.howtoforge.com/monitoring-ups-power-status-with-nut-on-opensuse10.3> on Feb. 25, 2010, (Apr. 14, 2008), 14 pages.

"PCT Search Report and Written Opinion", Application No. PCT/US2011/037627, (Feb. 9, 2012),10 pages.

"HP R3000v UPS Uninterruptible Power System (UPS)", Retrieved at << http://h18000.www1.hp.com/products/quickspecs/13129_div/13129_div.HTML >>, Version 2, Mar. 12, 2009, pp. 5.

Noer, Geoffrey., "Power and Cooling in a Containerised Data Center", Retrieved at << http://www.datacenterdynamics.com/ME2/dirmod.asp?sid=&nm=&type=Publishing
&mod=Publications::Article
&mid=8F3A7027421841978F18BE895F87F791&tier=4
&id=818B9E52878348FBA2CF87C3E00FAD54 >>, Jun. 25, 2009, pp. 2.

Hungria, Anderson, "Build for Today. Expand on Demand", Retrieved at << http://www.youpowerthrough.com/pdf/Modularity-AndersonHungaria.pdf >>, Nov. 2008, pp. 15.

"Next Generation Data Center Infrastructure", Feb. 21, 2010, Retrieved at << http://www.sgi.com/pdfs/4172.pdf >>, pp. 12.

"SHIP: Scalable Hierarchical Power Control for Large-Scale Data Centers", Retrieved at << http://ieeexplore.ieee.org/stamp/stamp.jsp?tp=&arnumber=5260553 >>, 18th International Conference on Parallel Architectures and Compilation Techniques, 2009. 10 Pages.

Rasmussen, Neil., "Power and Cooling Capacity Management for Data Centers", Retrieved at <<http://www.apcmedia.com/salestools/NRAN-6C25XM_R0_EN.pdf >>, 2007, pp. 18.

"Non-Final Office Action", U.S. Appl. No. 12/786,800, (Oct. 30, 2012), 13 pages.

"Non-Final Office Action", U.S. Appl. No. 12/822,949, (Sep. 6, 2012), 9 pages.

"Notice of Allowance", U.S. Appl. No. 12/797,497, (Dec. 3, 2012), 12 pages.

"Corrected Notice of Allowance", U.S. Appl. No. 12/797,497, (Jan. 28, 2013), 2 pages.

"PCT Search Report and Written Opinion", Application No. PCT/US2011/037076, (Dec. 26, 2011), 8 pages.

"PCT Search Report and Written Opinion", Application No. PCT/US2011/041022, (Dec. 20, 2011), 9 pages.

"Non-Final Office Action", U.S. Appl. No. 12/797,497, (May 10, 2012),21 pages.

"Notice of Allowance", U.S. Appl. No. 12/822,949, (Mar. 6, 2013), 7 pages.

"Final Office Action", U.S. Appl. No. 12/786,800, (Apr. 9, 2013), 16 pages.

"Non-Final Office Action", U.S. Appl. No. 12/786,800, (Sep. 25, 2013),16 pages.

"Notice of Allowance", U.S. Appl. No. 12/786,800, Feb. 20, 2014, 4 pages.

"Foreign Office Action", CN Application No. 201180025676.0, Jul. 30, 2014, 20 pages.

\* cited by examiner

CHASSIS SLOTS ACCEPTING BATTERY MODULES AND OTHER MODULE TYPES

BACKGROUND

Situations arise where it is desirable to have a large number of computers operating together at a particular location to provide a service, such as data centers or server farms providing services over the Internet. Oftentimes different customers or administrators of such locations have different interests, such as different desires as to whether particular computers are provided with battery backup power to protect against a power outage. It can be difficult for such locations to accommodate these different desires of various customers or administrators.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with one or more aspects, an apparatus includes multiple multi-function slots coupled to a component interconnect board. Each of the multi-function slots is configured to accept different types of modules, including a battery module and one or more other types of modules (e.g., server modules or storage modules). The apparatus also includes a power bus coupled to receive external power and route the external power to the multiple multi-function slots (and in certain situations to provide power received from battery modules in one or more of the multi-function slots to other ones of the multi-function slots).

BRIEF DESCRIPTION OF THE DRAWINGS

The same numbers are used throughout the drawings to reference like features.

DETAILED DESCRIPTION

Chassis slots accepting battery modules and other module types are discussed herein. A chassis in a data center includes multiple slots into which battery modules as well as other types of modules (e.g., server modules, storage modules, and so forth) can be inserted. The battery modules provide backup power to the other modules in the chassis, such as during times when external power is lost or times of peak power usage so that the battery can provide extra power beyond the provisioning abilities of the data center power distribution system. The chassis are designed with multiple multi-function slots, each such multi-function slot being configured to accept these different types of modules. The types of modules, and how many of each type of module, are inserted into the multi-function slots of a chassis can vary on a chassis-by-chassis basis, allowing a common chassis design to be used regardless of how many of each type of module are to be inserted into any particular chassis. Additionally, different types of modules can be inserted into the same slot on the chassis at different times, such as a server module being inserted into a slot for an amount of time and then removed and a battery module inserted into that same slot.

Figure 1:
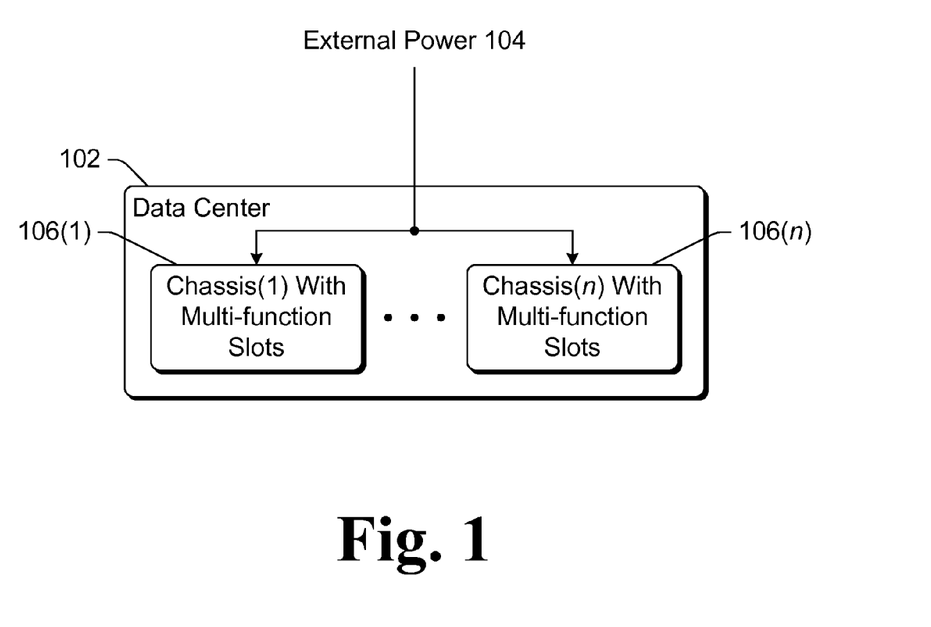
FIG. 1 illustrates an example system implementing the chassis slots accepting battery modules and other module types in accordance with one or more embodiments.

FIG. 1 illustrates an example system 100 implementing the chassis slots accepting battery modules and other module types in accordance with one or more embodiments. System 100 includes a data center 102 that receives external power 104. Data center 102 includes one or more (n) chassis 106(1), . . . , 106(n), each including one or more multi-function slots. The multi-function slots accept battery modules as well as one or more of a variety of other types of modules, such as storage modules, server modules, and so forth. Accordingly, different types of modules can be inserted into each of the multi-function slots at different times, as discussed in more detail below. The different chassis 106 can be arranged in different manners, such as each chassis 106 being a separate device (e.g., a single rack), one or more chassis 106 being included in a same device (e.g., the same rack), and so forth.

In system 100, external power 104 is AC and/or DC power received from one or more conventional external power sources. Such an external power source can be, for example, a power station managed by a power utility company, a backup generator such as a diesel-powered or gas-powered generator associated with data center 102, and so forth. External power 104 is referred to as external power because it is received from a source external to chassis 106.

Data center 102 operates to provide one or more services to various computing devices. These computing devices can be located in close physical proximity to data center 102, and/or located across a wide geographic range (e.g., throughout a country or throughout the world). Data center 102 can communicate with such computing devices via a variety of different networks, including the Internet, a local area network (LAN), a cellular or other phone network, an intranet, other public and/or proprietary networks, combinations thereof, and so forth. Data center 102 can be accessed by a variety of different types of computing devices, such as a desktop computer, a laptop computer, a notepad or tablet computer, a mobile station, an entertainment appliance, a television, a set-top box communicatively coupled to a display device, a cellular or other wireless phone, a game console, an automotive computer, and so forth.

Data center 102 can provide one or more of a variety of different services to computing devices. For example, data center 102 can provide one or more of a social networking service, an email service, a search service, an information resource/storage service, a messaging service, an image and/or video sharing service, a gaming or other entertainment service, and so forth. The one or more services provided by data center 102 can be publicly available or alternatively access to one or more of the services can be restricted to particular users (e.g., those having a valid account as verified by a service of data center 102).

Multiple modules inserted into the multi-function slots of chassis 106 in data center 102 operate to provide the functionality of the one or more services provided by data center 102. A variety of different types of modules can be included in data center 102. Data center 102 typically includes one or more server modules (e.g., that include components such as one or more processors, random access memory, Flash memory, and so forth). Data center 102 can also include one or more other types of modules, such as a networking module (e.g., a gateway, a router, a switch, etc.), a data storage module (e.g., one or more magnetic disk drives), a battery module, and so forth.

Chassis 106 can be configured with different numbers of multi-function slots, such as 50 slots, 90 slots, and so forth. Additionally, different chassis 106 (or chassis 106 at different times) can have different types of modules, and different numbers of each of those different types of modules, inserted into the multi-function slots of that chassis. The number of battery modules inserted into the multi-function slots can vary, for example depending on the desired hold-up time for the chassis 106 (the amount of time other modules in chassis 106 are to be able to continue operation in the event of an interruption in external power 104) and/or the desired amount of power to be provided during times of peak power usage (as discussed in more detail below). Battery modules could also be configured with different storage capacities by varying the number of batteries and/or types of batteries.

By way of example, in a chassis 106 with 48 slots, 36 of the slots can be filled with server modules and 12 slots filled can be filled with data storage modules if zero hold-up time is desired. Continuing with this example, if 30 seconds hold-up time is desired, then 4 server modules can be removed and each replaced with a battery module, and if 5 minutes of hold-up time is desired, then 16 processor and/or storage modules can each be replaced with a battery module.

Figure 2:
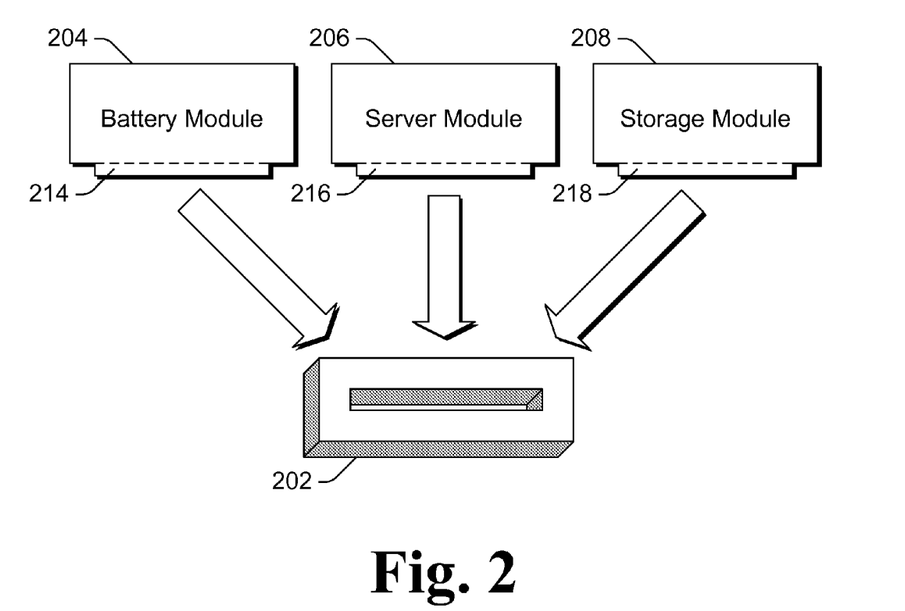
FIG. 2 is a block diagram illustrating an example chassis slot accepting multiple different types of modules in accordance with one or more embodiments.

FIG. 2 is a block diagram illustrating an example chassis slot accepting multiple different types of modules in accordance with one or more embodiments. FIG. 2 illustrates a multi-function slot 202 and three different types of modules: a battery module 204, a server module 206, and a storage module 208. It should be noted that modules 204, 206, and 208 are examples, and that other types of modules can also be used with multi-function slot 202.

Multi-function slot 202 is mounted on or otherwise coupled to a common interconnect board, as discussed in more detail below. Multiple multi-function slots 202 are typically coupled to the same common interconnect board, allowing different modules inserted into different slots 202 to communicate with one another. Multi-function slot 202 also routes power to and/or from the module that is inserted into slot 202.

Each of modules 204, 206, and 208 includes a tab portion 214, 216, and 218, respectively, that is compatible with multi-function slot 202. Tab portions 214, 216, and 218 include contacts, pins, or other connection mechanisms that line up with contacts, receptors, or other connection mechanisms of multi-function slot 202. Accordingly, when a module 204, 206, or 208 is inserted into multi-function slot 202, components on the module 204, 206, or 208 can receive power from the common interconnect board to which multi-function slot 202 is coupled (or provide power to the common interconnect board in the case of battery module 204), and communicate with other modules inserted into other slots of the common interconnect board to which multi-function slot 202 is coupled. Although multi-function slot 202 can accept various different types of modules 204-208, it should be noted that a single module 204-208 is inserted into multi-function slot 202 at any particular time.

Figure 3:
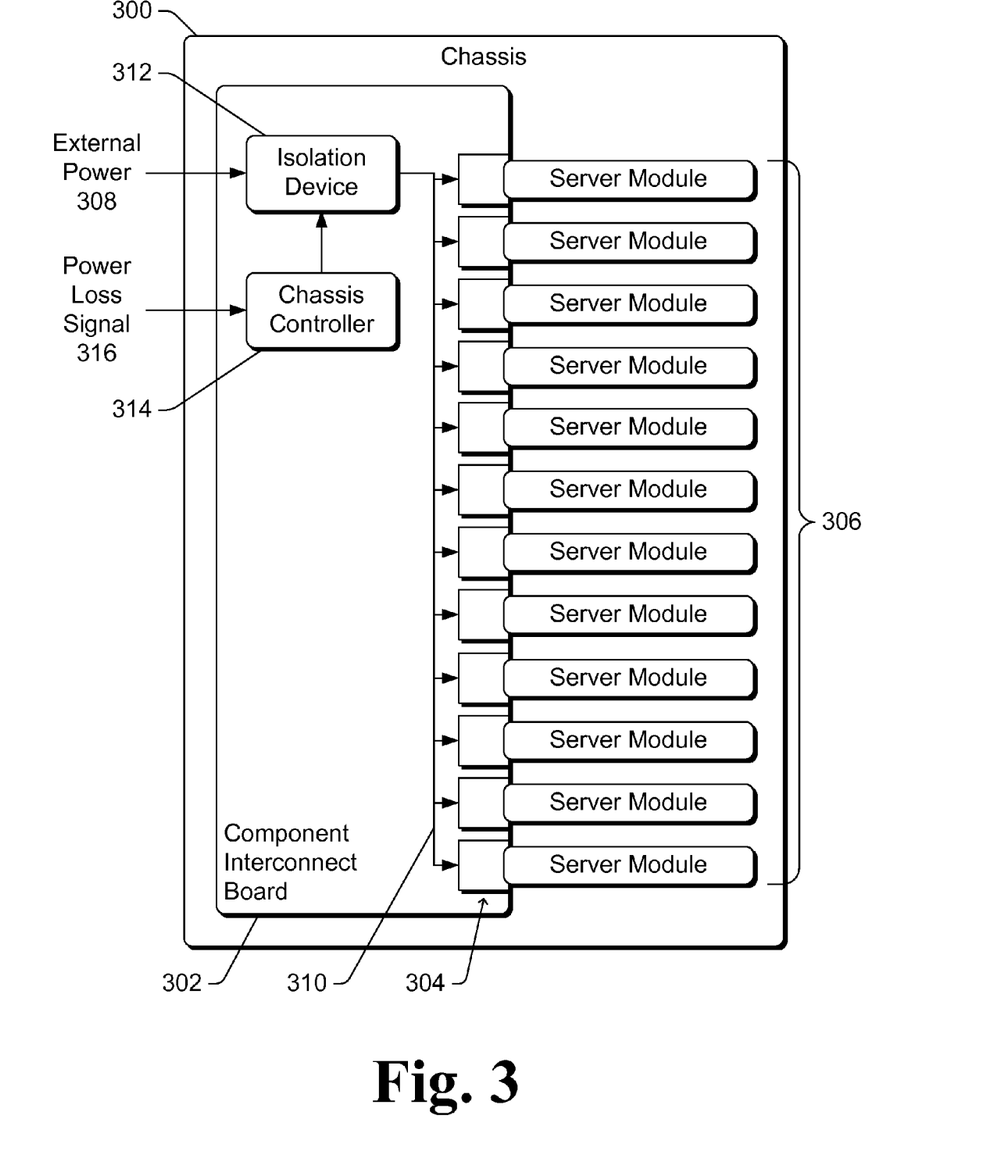
FIG. 3 is a block diagram illustrating an example chassis implementing the chassis slots accepting battery modules and other module types in accordance with one or more embodiments.

FIG. 3 is a block diagram illustrating an example chassis 300 implementing the chassis slots accepting battery modules and other module types in accordance with one or more embodiments. Chassis 300 includes a common interconnect board 302 and multiple multi-function slots 304 coupled to common interconnect board 302. Multi-function slots 304 can be mounted or otherwise coupled to common interconnect board 302 in any of a variety of well-known manners. In the example of FIG. 3, server modules 306 are inserted into the multi-function slots 304. External power 308 is received at chassis 300 and routed to multi-functions slots 304 via power bus 310. Multi-function slots 304 route external power 308 received via power bus 310 to server modules 306. For example, each multi-function slot 304 can include one or more pins, contacts, or other connection mechanisms allowing power from power bus 310 to be routed to the server module 306 inserted into the slot 304. External power 308 can be, for example, external power 104 of FIG. 1.

Chassis 300 also includes an isolation device 312 and chassis controller 314. In the event of an interruption in external power 308, isolation device 312 and chassis controller 314 are used to isolate chassis 300 from external power 308 and notify any battery modules that may be inserted into multi-function slots 304 to provide power to chassis 300. This allows battery modules in chassis 300 to provide power in the event of an interruption in external power 308. As no battery modules are illustrated in FIG. 3, no such battery power would be provided to power chassis 300 in the event of an interruption in external power 308. Alternatively, as no battery modules are illustrated in FIG. 3, isolation device 312 and chassis controller 314 may take no action to isolate chassis 300 from external power 308 and/or to notify modules that may be inserted into multi-function slots 304 to provide power to chassis 300.

It should be noted that FIG. 3 illustrates an example power topology for chassis 300. Other signals and information can be communicated among various server modules 304 and other components of chassis 300 (e.g., chassis controller 314). For example, chassis 300 can include one or more additional data and/or control buses to allow data and/or control information to be routed among modules 306, other components of chassis 300, and to other components or devices external to chassis 300. These additional buses or other signal routings are not illustrated in FIG. 3 in order to avoid cluttering the drawings.

Additionally, it should be noted that isolation device 312 and/or chassis controller 314 can perform other operations as well. For example, isolation device 312 can be used to cycle the power provided to power bus 310 and thus reboot server modules 306. Depending on the power topology implemented for chassis 300, isolation device 312 can be used to cycle the power to all server modules 306, or alternatively to selected ones of server modules 306.

In one or more embodiments, chassis controller 314 detects whether any battery modules are inserted into multi-function slots 304. Chassis controller 314 can detect the type of module inserted into a multi-function slot 304 in different manners, such as receiving signals from the battery modules via a data and/or control bus, isolating chassis 300 from external power 308 and detecting whether any power is being provided on power bus 310, and so forth. If no battery modules are inserted into multi-function slots 304, then chassis controller 314 need not (but alternatively can) signal isolation device 312 to isolate chassis 300 from external power 308 in the event of an interruption in external power 308.

Figure 4:
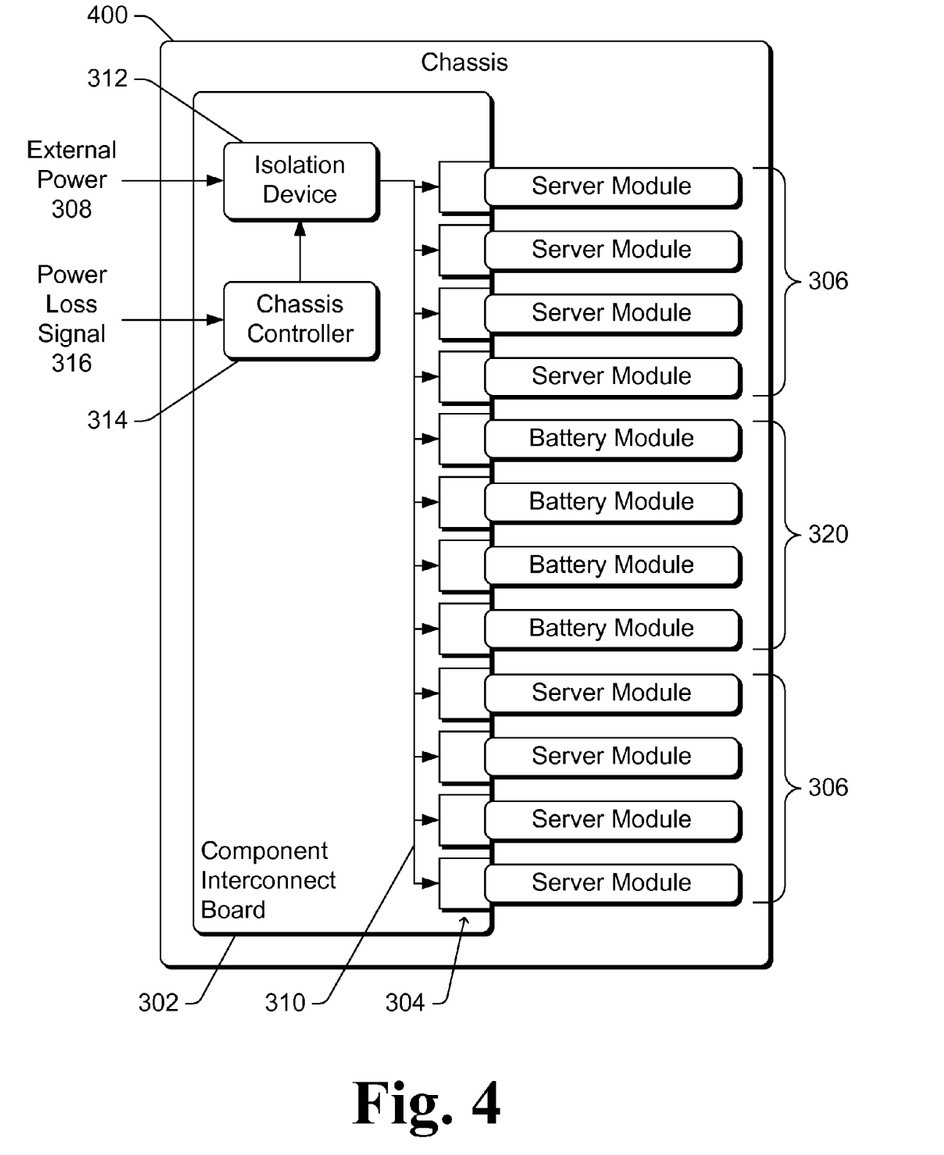
FIG. 4 is a block diagram illustrating another example chassis implementing the chassis slots accepting battery modules and other module types in accordance with one or more embodiments.

FIG. 4 is a block diagram illustrating another example chassis 400 implementing the chassis slots accepting battery modules and other module types in accordance with one or more embodiments. Chassis 400 is similar to chassis 300 of FIG. 3, including a common interconnect board 302 that is configured the same as common interconnect board 302 of FIG. 3 (including multi-function slots 304, power bus 310, isolation device 312, and chassis controller 314). However, chassis 400 differs from chassis 300 in that server modules 306 are inserted into some multi-function slots 304, while battery modules 320 are inserted into other multi-function slots 304. As battery modules 320 are included in chassis 400, battery power can be provided to power chassis 400 in the event of an interruption in external power 308 and/or during times of peak power usage. Battery modules 320 thus operate' as a battery backup for other modules in chassis 400 in the event of an interruption in external power 308 and/or as an additional power supply in the event of a peak in power usage. Chassis 400 and chassis 300 of FIG. 3 can be different chassis (but using commonly configured component interconnect boards 302). Alternatively, chassis 400 can be chassis 300 of FIG. 3 at a different point in time (e.g., a point in time in which battery modules 320 are removed from chassis 400 and replaced with server modules).

In one or more embodiments, a monitor or other controller in the data center that includes chassis 400 monitors external power 308 and detects an interruption in external power 308. This monitor or other controller is typically external to chassis 400. A variety of causes exist for such an interruption, such as a failure at a power station that provides power 308, a failure in a power transmission line between such a power station and the data center, and so forth. If an interruption in external power 308 is identified, the monitor or other controller provides power loss signal 316 to chassis controller 314, notifying chassis controller 314 of the interruption in power.

If an interruption in external power 308 is identified, chassis controller 314 signals battery modules 320 to provide power to chassis 400 due to the interruption in external power 308. In response, battery modules 320 provide power on power bus 310 that is routed to server modules 306 in place of external power 308. Battery modules 320 operate as a battery backup for server modules 306, allowing server modules 306 to continue to operate despite the interruption in external power 308. Chassis controller 314 can also optionally provide various other signals to server modules 306, such as signaling to server modules 306 to reduce or throttle back their performance (e.g., use a lower clock frequency, shut down one or more processor cores, use a lower data transfer rate, etc.) in response to an interruption in external power 308 being identified.

Additionally, if an interruption in external power 308 is identified, chassis controller 314 optionally signals isolation device 312 to isolate chassis 400 from external power 308. This isolation prevents any power being provided by battery modules 320 from being discharged on the line or lines via which external power 308 is received by component interconnect board 302.

When the interruption in external power 308 ceases (e.g., the problem causing the interruption has been fixed or a backup generator is providing power), the monitor or other controller optionally provides an indication to chassis controller 314 that the interruption in external power has ceased. This indication can be provided in different manners, such as a separate signal line input to chassis controller 314, the monitor or other controller sending a different value over the same line as power loss signal 316 was sent, and so forth.

If an indication that the interruption in external power 308 has ceased is received, chassis controller 314 signals battery modules 320 to cease providing power to chassis 400. In response, battery modules 320 cease providing power on power bus 310. Chassis controller 314 can also optionally provide various other signals to server modules 306, such as signaling server modules 306 to cease reducing or throttling back their performance. Additionally, if an indication that the interruption in external power 308 has ceased is received, chassis controller 314 also signals isolation device 312 to cease isolating chassis 400 from external power 308.

Chassis controller 314 can optionally perform various other functions as well. For example, chassis controller 314 can detect which multi-function slots 304 have battery modules inserted into them, and which multi-function slots 304 have other types of modules inserted into them (the specific type of module, such as server module or storage module can be detected, or simply that they are not battery modules can be detected). The number of battery modules inserted into multi-function slots 304 and the number of other types of battery modules inserted into multi-function slots 304 can be identified by chassis controller 314. Chassis controller 314 can then use these numbers (along with an indication of the battery capacity of the battery modules and the power used by the other types of modules) to readily determine the hold-up time that those batteries modules can provide for the other types of modules inserted into multi-function slots 304 of chassis 400.

Chassis controller 314 can be pre-configured with (or obtain from another controller or other source) the battery capacity of the battery modules and the power used by other types of modules. Alternatively, each of one or more battery modules can indicate to chassis controller 314 (e.g., via one or more signals on a data and/or control bus) the amount of power that it provides. Similarly, each of one or more other types of modules can indicate to chassis controller 314 (e.g., via one or more signals on a data and/or control bus) the amount of power that the module uses. Chassis controller 314 can use this information regarding battery capacity and power used by other modules to determine the hold-up time that those battery modules can provide.

Figure 5:
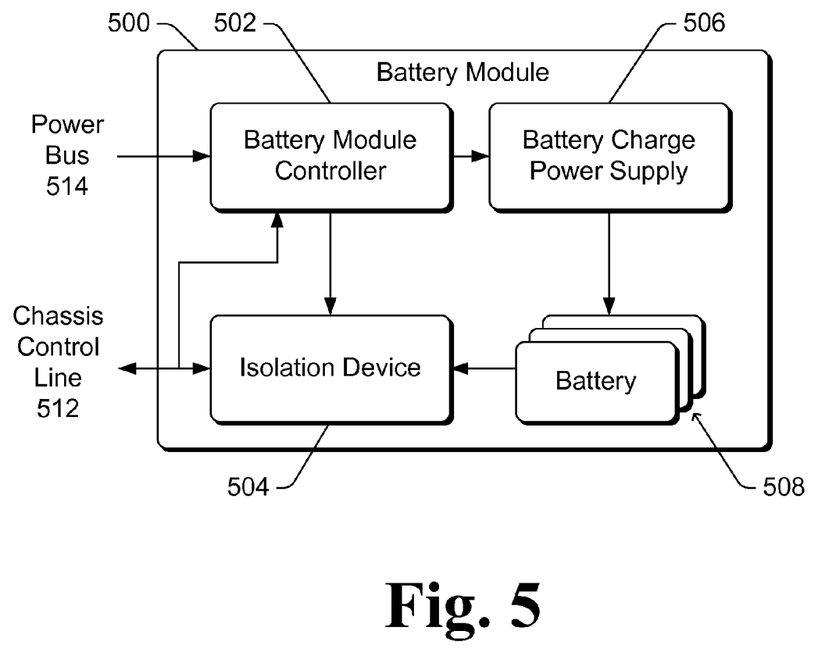
FIG. 5 is a block diagram illustrating an example battery module in accordance with one or more embodiments.

FIG. 5 is a block diagram illustrating an example battery module 500 in accordance with one or more embodiments. Battery module 500 can be, for example, a battery module 320 of FIG. 4. Battery module 500 includes a battery module controller 502, an isolation device 504, a battery charge power supply 506, and one or more batteries 508. Control information is received by battery module 500 from a chassis controller (e.g., chassis controller 314 of FIGS. 3 and 4) via chassis control line 512. External power is routed to battery module 500 via power bus 514, and power from battery module 500 can be provided to other modules in the same chassis as battery module 500 via power bus 514. Power bus 514 can be, for example, power bus 310 of FIGS. 3 and 4.

Battery module controller 502 manages the operation of battery module 500, receiving indications from a chassis controller (e.g., chassis controller 314 of FIGS. 3 and 4) of interruptions in external power and providing information regarding the status of battery module 500 to the chassis controller. Battery module controller 502 controls when batteries 508 can be discharged to power bus 514, such as when there is an interruption in external power or for power smoothing.

In the event of a loss in external power, the chassis controller (e.g., chassis controller 314 of FIGS. 3 and 4) provides a signal to battery module controller 502 via chassis control line 512, notifying battery module controller 502 of the interruption in power. In response to the interruption in external power, battery module controller 502 signals isolation device 504 to allow batteries 508 to discharge power to power bus 514. This allows batteries 508 to power other modules in the same chassis as battery module 500.

At some point after the interruption in power occurs, the providing of external power to the chassis resumes, at which point battery module controller 502 signals isolation device 504 to no longer allow batteries 508 to discharge power to power bus 514.

Isolation device 504 also operates to isolate batteries 508 from power bus 514, preventing batteries 508 from discharging power to power bus 514 except at times when batteries 508 are discharged to power bus 514 due to an interruption in external power or for power smoothing. For example, isolation device 504 prevents batteries 508 from discharging power to power bus 514 even if the voltage provided by batteries 508 is greater than the voltage on processor bus 514. By way of another example, if batteries 508 are charging and at a lower voltage than power bus 514, isolation device 504 prevents power bus 514 from charging batteries 508.

Batteries 508 can be a variety of different types of rechargeable energy storage devices, such as sealed lead-acid batteries, lithium ion batteries, capacitors, supercapacitors, rotary devices, coiled spring devices, alternate power sources, and so forth. It should also be noted that different battery modules 500 inserted into multi-function slots of the same chassis can include different types of batteries 508. For example, some battery modules 500 may include capacitors or supercapacitors, while other types of batteries 508 can include lithium ion batteries. The chassis controller (e.g., chassis controller 314 of FIGS. 3 and 4) can signal all battery modules 500 to discharge power (e.g., in the event of an interruption in external power) to power bus 514, or alternatively signal different battery modules 500 to discharge power to power bus 514 at different times. For example, the chassis controller can initially signal battery modules 500 that include capacitors or supercapacitors to discharge power to power bus 514. If the interruption in external power continues for at least a threshold amount of time, then the chassis controller signals battery modules 500 to discharge power to power bus 514.

When batteries 508 have less than a threshold charge, battery charge power supply 506 charges batteries 508. This threshold charge can be a fixed amount (e.g., a particular number of watt hours), or alternatively a relative amount (e.g., 10% less than the maximum charge of batteries 508). When batteries 508 have less than the threshold charge can be detected by battery charge power supply 506, or alternatively by battery module controller 502. Battery charge power supply 506 receives power from power bus 514 (e.g., via or under control of battery module controller 502), and provides that received power to batteries 508 to charge batteries 508.

In one or more embodiments, battery module controller 502 also monitors various aspects of batteries 508, such as usage and/or health information regarding batteries 508. This usage and/or health information can be, for example, an indication of a current charge of batteries 508, an indication of a maximum charge of batteries 508, and so forth. The information monitored by battery module controller 502 can be returned to a chassis controller (e.g., chassis controller 314 of FIGS. 3 and 4) via chassis control line 512, allowing the chassis controller to collect information regarding the monitored aspects of batteries 508 of all the battery modules included in the chassis. The chassis controller can then display or otherwise present such information to, for example, an administrator of the data center in which the chassis is located.

In one or more embodiments, battery module controller 502 also signals isolation device 504 to allow batteries 508 to discharge power to power bus 514 to facilitate power smoothing on power bus 514. Situations can arise in which there is a peak in power usage by one or more modules in the same chassis as battery module 500, and this peak results in the power supplied from a power supply on power bus 514 being exceeded. Such a power supply is typically included in the data center that includes battery module 500, and can be included in the same chassis as battery module 500 or alternatively external to the chassis that includes battery module 500. Such a power supply receives power from an external source (e.g., a power station or a backup generator) and provides power on power bus 514. These power supplies can perform various operations, such as converting AC power to DC power, increasing or decreasing DC power received from an external source, and so forth.

Such peaks in power usage are oftentimes short in duration (e.g., on the order of a few seconds). Battery module controller 502 is configured to provide power from batteries 508 to power bus 514 during these times of peak power usage, providing power on power bus 514 concurrently with the power supply providing power on power bus 514. Batteries 508 can thus effectively absorb power usage peaks, allowing the average current drawn by modules in the same chassis as battery module 500 to remain approximately flat or unchanged. It should be noted that during times of peak power usage, batteries 508 can provide power on power bus 514 in the absence of any interruption of external power as well as during an interruption of external power.

Peak power usage that exceeds the power supplied by the power supply can be detected in a variety of different manners. In one or more embodiments, battery module controller 502 monitors one or more of various indicators related to the power supplied by the power supply to determine when peak power usage exceeds the power supply on power bus 514. For example, battery module controller 502 can monitor the input current on power bus 514, such as by using a series resistor or inductive loop. By way of another example, power battery module controller 502 can monitor the output current of a power supply coupled to power bus 514, such as by using a series resistor, inductive loop, or monitoring the voltage drop across an output FET (field-effect transistor). By way of another example, battery module controller 502 can monitor the switching frequency of an output rectifier of a power supply coupled to power bus 514 (e.g., higher duty cycles indicating higher power usage). One or more of these various indicators can be used to identify the power usage of modules receiving power via power bus 514.

During times of peak usage, the module or modules that are peaking in their power usage can receive the power they desire and continue to operate as they desire. Performance of the devices need not be cut back or throttled due to a lack of power. Furthermore, a power supply coupled to power bus 514 need not be configured to provide all of the power during these times of peak usage, but can rely on batteries 508 during these times of peak usage. This allows for a lower cost power supply because the power supply can be sized for the average power used by the modules on the chassis rather than for the peak power usage. Furthermore, the system (e.g., data center) that includes the chassis has more predictable power loads, and thus need not provide an extra power margin in order to provide power during these times of peak usage because it is relying on batteries 508.

In the discussions above, battery module controller 502 receives a signal via chassis control line 512 that notifies battery module controller 502 of the interruption in power. Alternatively, no such signal need be received. Rather, battery module controller 502 can monitor one or more of various indicators related to the power supplied by the power supply to determine when the power used by modules on power bus 514 exceeds the power supply on power bus 514. This can be determined in different manners as discussed above. Battery module controller 502 signals isolation device 504 to allow batteries 508 to discharge power to power bus 514 if the power supplied by the power supply exceeds the power used by modules on power bus 514. Battery module controller 502 then signals isolation device 504 to isolate batteries 508 from power bus 514 when the power used by modules on power bus 514 no longer exceeds the power supplied by the power supply. It should be noted that battery module controller 502 need not determine why the power used by modules on power bus 514 exceeds the power supplied by the power supply. E.g., battery module controller 502 can simply detect that the power used by modules on power bus 514 exceeds the power supplied by the power supply (whether due to an interruption in external power or a peak in power usage), and in response signal isolation device 504 to allow batteries 508 to discharge power to power bus 514.

Figure 6:
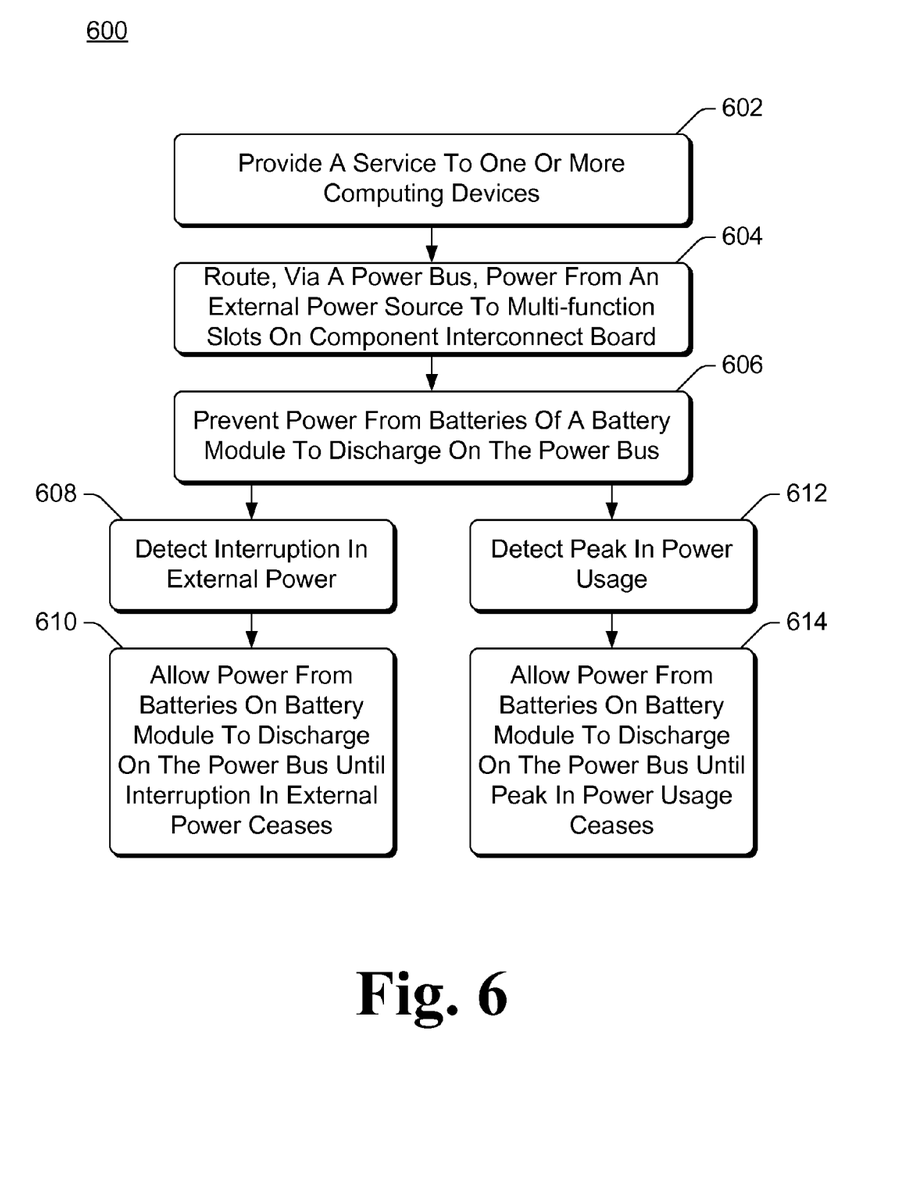
FIG. 6 is a flowchart illustrating an example process for using chassis slots accepting battery modules and other module types in accordance with one or more embodiments.

FIG. 6 is a flowchart illustrating an example process 600 for using chassis slots accepting battery modules and other module types in accordance with one or more embodiments. Process 600 is carried out by a chassis of a data center, such as a chassis 106 of FIG. 1, and can be implemented in software, firmware, hardware, or combinations thereof. Process 600 is shown as a set of acts and is not limited to the order shown for performing the operations of the various acts. Process 600 is an example process for using chassis slots accepting battery modules and other module types; additional discussions of using chassis slots accepting battery modules and other module types are included herein with reference to different figures.

In process 600, a service is provided to one or more computing devices (act 602). A variety of different services can be provided to computing devices located in close physical proximity to the chassis implementing process 600 and/or located across a wide geographic range as discussed above.

Power received from an external power source is routed to multi-function slots on a component interconnect board of the chassis (act 604). This external power source can be, for example, a power station managed by a power utility company or a backup generator as discussed above.

Power from batteries of a battery module is prevented from being discharged on the power bus (act 606). This battery module is a battery module inserted into one of the multi-function slots of the component interconnect board of the chassis. Power from the batteries is prevented from being discharged on the power bus unless an interruption in the external power is detected or a peak in power usage is detected as discussed above.

In the event of an interruption in external power being detected (act 608), power is allowed to be discharged from the batteries of the battery module to the power bus (act 610). Power is allowed to be discharged from the batteries until the interruption in external power ceases.

In the event of a peak in power usage being detected (act 612), power is allowed to be discharged from the batteries of the battery module to the power bus (act 614). Power is allowed to be discharged from the batteries until the peak in power usage ceases.

It should be noted that the chassis slots accepting battery modules and other module types discussed herein supports various usage scenarios. The types of modules, and how many of each type of module, to include in a chassis can vary on a chassis-by-chassis basis. An administrator or customer of the data center can determine whether battery modules are to be included in the chassis (e.g., based on the particular functionality provided by the modules of the chassis). The appropriate number of battery modules can then be inserted into multi-function slots of the chassis to provide the amount of power for the duration desired by the administrator or customer of the data center. Other types of modules (e.g., server modules, storage modules, etc.) can be inserted into any of the multi-function slots of the chassis into which a battery module is not inserted.

For example, different customers of a data center, such as different companies or different business units within the same company, are assigned different chassis and are able to select the configuration of their own chassis. These different companies or business units can select different numbers of battery modules, and thus have different battery backup configurations, even though their chassis are in the same data center. A first business unit may desire to have sufficient batteries to power the modules in their chassis for the time period between an interruption in external power from a power station and a backup generator being online, and accordingly would have a chassis with sufficient battery modules to provide this power. A second business unit may not be interested in spending money on any batteries, and accordingly would have a chassis with no battery modules. This second business unit can then have all of the multi-function slots of the chassis populated with other types of modules (e.g., server modules, storage modules, etc.).

Additionally, it should be noted that the chassis slots accepting battery modules and other module types discussed herein permits using smaller, more commonly available batteries in battery modules rather than using large, custom-built batteries for an entire data center. As these batteries in the battery modules are not custom-built, they are typically a lower cost than custom-built batteries.

Furthermore, it should be noted that the chassis slots accepting battery modules and other module types discussed herein can reduce overall costs for data centers and their customers. A common chassis design can be used in the data center, and in multiple different data centers, regardless of the number of battery modules that a particular customer desires to use in their chassis. The chassis need not include dedicated slots for battery modules, and thus any slots not used for battery modules can be populated with other types of modules.

In the discussion herein, reference is made to various different controllers (e.g., chassis controller 314 of FIG. 3 or FIG. 4, battery module controller 502 of FIG. 5, and so forth). Generally, each controller accepts one or more inputs, and provides one or more outputs based at least in part on those one or more inputs. Each of the controllers discussed herein can be implemented in a variety of different manners. For example, a controller can be implemented as a processor executing software and/or firmware instructions. By way of another example, a controller can be implemented using discrete logic, a programmable logic device, and so forth.

Figure 7:
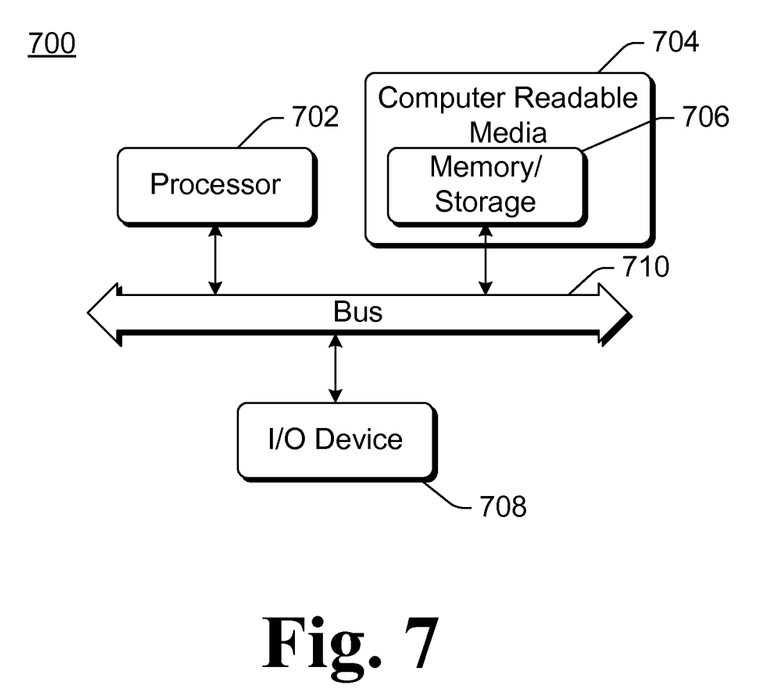
FIG. 7 illustrates an example computing device that can be used with the chassis slots accepting battery modules and other module types in accordance with one or more embodiments.

FIG. 7 illustrates an example computing device 700 that can be used with the chassis slots accepting battery modules and other module types in accordance with one or more embodiments. Computing device 700 can be, for example, a server module 206 or storage module 208 of FIG. 2. Computing device 700 can also implement various controllers discussed herein, such as chassis controller 314 of FIGS. 3 and 4, or battery module controller 502 of FIG. 5.

Computing device 700 includes one or more processors or processing units 702, one or more computer readable media 704 which can include one or more memory and/or storage components 706, one or more input/output (I/O) devices 708, and a bus 710 that allows the various components and devices to communicate with one another. Computer readable media 704 and/or one or more I/O devices 708 can be included as part of, or alternatively may be coupled to, computing device 700. Bus 710 represents one or more of several types of bus structures, including a memory bus or memory controller, a peripheral bus, an accelerated graphics port, a processor or local bus, and so forth using a variety of different bus architectures. Bus 710 can include wired and/or wireless buses.

Memory/storage component 706 represents one or more computer storage media. Component 706 can include volatile media (such as random access memory (RAM)) and/or non-volatile media (such as read only memory (ROM), Flash memory, optical disks, magnetic disks, and so forth). Component 706 can include fixed media (e.g., RAM, ROM, a fixed hard drive, etc.) as well as removable media (e.g., a Flash memory drive, a removable hard drive, an optical disk, and so forth).

The techniques discussed herein can be implemented in software, with instructions being executed by one or more processing units 702. It is to be appreciated that different instructions can be stored in different components of computing device 700, such as in a processing unit 702, in various cache memories of a processing unit 702, in other cache memories of device 700 (not shown), on other computer readable media, and so forth. Additionally, it is to be appreciated that the location where instructions are stored in computing device 700 can change over time.

One or more input/output devices 708 allow a user to enter commands and information to computing device 700, and/or allow information to be presented to the user and/or other components or devices. Examples of input devices include a keyboard, a cursor control device (e.g., a mouse), a microphone, a scanner, and so forth. Examples of output devices include a display device (e.g., a monitor or projector), speakers, a printer, a network card, and so forth.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media can be any available medium or media that can be accessed by a computing device. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embody computer readable instructions, data structures, program modules, or other data in a modulated data signal, such as carrier wave or other transport mechanism. Communication media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media. Combinations of any of the above are also included within the scope of computer readable media.

Generally, any of the functions or techniques described herein can be implemented using software, firmware, hardware (e.g., fixed logic circuitry), manual processing, or a combination of these implementations. The terms "module" and "component" as used herein generally represent software, firmware, hardware, or combinations thereof. In the case of a software implementation, the module or component represents program code that performs specified tasks when executed on a processor (e.g., CPU or CPUs). The program code can be stored in one or more computer readable memory devices, further description of which may be found with reference to FIG. 7. The features of the chassis slots accepting battery modules and other module types techniques described herein are platform-independent, meaning that the techniques can be implemented on a variety of commercial computing platforms having a variety of processors.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
a component interconnect board;
multiple multi-function slots each coupled to the component interconnect board, each of the multi-function slots being configured to accept different types of modules, the different types of modules including a battery module operable to provide backup power functionality to modules inserted into other multi-function slots of said component interconnect board, and one or more other types of modules operable to provide one or more functionalities other than battery functionality; and
a power bus coupled to receive external power and route the external power to the multiple multi-function slots.

2. An apparatus as recited in claim 1, wherein the one or more other types of modules comprise a server module.

3. An apparatus as recited in claim 1, wherein the one or more other types of modules comprise a storage module.

4. An apparatus as recited in claim 1, wherein the apparatus comprises a chassis in a data center.

5. An apparatus as recited in claim 4, wherein:
the chassis has multiple battery modules, multiple server modules, and multiple storage modules coupled thereto; and
each of the multiple battery modules, multiple server modules, and multiple storage modules is inserted into one of the multiple multi-function slots.

6. An apparatus as recited in claim 1, wherein the battery module provides power to the power bus in response to an interruption in the external power.

7. An apparatus as recited in claim 1, wherein the battery module provides power to the power bus in response to a peak in power usage by additional modules, each of the additional modules being inserted into one of the multiple multi-function slots.

8. An apparatus as recited in claim 1, wherein the battery module comprises one or more batteries and a battery charge power supply to receive the external power from the power bus and recharge the one or more batteries.

9. An apparatus as recited in claim 8, wherein the battery module further comprises a battery module controller and an isolation device, wherein the isolation device is to prevent power from the one or more batteries from being discharged on the power bus except when the battery module controller signals the isolation device to allow power from the one or more batteries to be discharged on the power bus.

10. An apparatus as recited in claim 9, wherein the battery module controller is to signal to the isolation device to allow power from the one or more batteries to be discharged on the power bus in response to an indication received from a chassis controller that the external power has been interrupted.

11. An apparatus as recited in claim 9, wherein the battery module controller is to signal to the isolation device to allow power from the one or more batteries to be discharged on the power bus in response to detecting a peak in power usage by additional modules inserted into additional ones of the multiple multi-function slots.

12. An apparatus as recited in claim 1, wherein the battery module comprises one or more batteries and a battery module controller to control an isolation device to prevent power from the one or more batteries from being discharged on the power bus except in response to an interruption in the external power or in response to a peak in power usage by additional modules inserted into additional ones of the multiple multi-function slots.

13. An apparatus as recited in claim 1, wherein the chassis has multiple battery modules, and one of the multiple battery modules includes a first type of energy storage device, another of the multiple battery modules includes a second type of energy storage device, and the first type of energy storage device is a different type of energy storage device than the second type of energy storage device.

14. A method implemented in a data center, the method comprising:
  providing, using one or more server, networking, or storage modules in a chassis of the data center, a service to one or more computing devices; and
  routing, using a power bus, power from an external power source to each of multiple multi-function slots on a component interconnect board of a chassis in the data center, each of the one or more server, networking, or storage modules being inserted into one of the multiple multi-function slots, each of the multiple multi-function slots being configured to accept different types of modules including a battery module and one or more server, networking, or storage modules, wherein each inserted module is operable to function as intended.

15. A method as recited in claim 14, further comprising, for each of the one or more server modules, allowing the server module to be replaced by a battery module inserted into the multi-function slot in which the server module was inserted.

16. A method as recited in claim 14, wherein multiple battery modules are inserted into multiple ones of the multiple multi-function slots, the method further comprising routing power from the one or more battery modules to the one or more server modules in response to an interruption in the power from the external power source.

17. A method as recited in claim 16, further comprising:
  receiving an indication of the interruption in the power; and
  isolating, in response to receiving the indication, the power bus from the external power source.

18. A method as recited in claim 14, wherein multiple battery modules are inserted into multiple ones of the multiple multi-function slots, the method further comprising routing power from the one or more battery modules to the one or more server modules in response to a peak in power usage by the one or more server modules.

19. A method as recited in claim 14, the providing further comprising continuing providing the service in the event of one of the one or more server modules being replaced by an additional battery module.

20. An apparatus comprising:
  a component interconnect board;
    multiple multi-function slots each coupled to the component interconnect board, each of the multi-function slots being configured to accept different types of modules, the different types of modules including a battery module and a server module;
  a power bus coupled to receive external power and route the external power to the multiple multi-function slots;
  one or more battery modules inserted into a first one or more of the multiple multi-function slots, each of the one or more battery modules including:
    one or more batteries,
    a battery charge power supply to receive the external power from the power bus and recharge the one or more batteries,
    a battery module controller, and
    an isolation device to prevent power from the one or more batteries from being discharged on the power bus except when the battery module controller signals the isolation device to allow power from the one or more batteries to be discharged on the power bus;
  one or more server modules inserted into a second one or more of the multiple multi-function slots; and
  a chassis controller operable to detect the specific battery or non-battery type of module inserted into each of the multiple multi-function slots.

* * * * *